United States Patent
Cho et al.

(10) Patent No.: US 8,179,718 B2
(45) Date of Patent: May 15, 2012

(54) MEMORY DEVICE AND MEMORY PROGRAMMING METHOD

(75) Inventors: Kyoung Lae Cho, Yongin-si (KR); Yoon Dong Park, Yongin-si (KR); Jun Jin Kong, Yongin-si (KR); Yong June Kim, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 644 days.

(21) Appl. No.: 12/318,560

(22) Filed: Dec. 31, 2008

(65) Prior Publication Data

US 2010/0002506 A1      Jan. 7, 2010

(30) Foreign Application Priority Data

Jul. 4, 2008   (KR) .................. 10-2008-0065068

(51) Int. Cl.
*G11C 16/04* (2006.01)
*G11C 16/06* (2006.01)

(52) U.S. Cl. .......... 365/185.03; 365/185.09; 365/185.18
(58) Field of Classification Search ............. 365/185.03, 365/185.09, 185.18
See application file for complete search history.

(56) References Cited

U.S. PATENT DOCUMENTS

| 2007/0297226 A1 | 12/2007 | Mokhlesi |
| 2008/0137415 A1* | 6/2008 | Lee ............ 365/185.03 |
| 2009/0003057 A1* | 1/2009 | Kang et al. ........ 365/185.03 |

FOREIGN PATENT DOCUMENTS

| JP | 2005-243183 | 9/2005 |
| JP | 2006-048783 | 2/2006 |
| JP | 1997-022387 | 1/2007 |
| KR | 10-2007-0085319 | 8/2007 |
| KR | 10-2008-0007544 | 1/2008 |

* cited by examiner

*Primary Examiner* — Hoai V Ho
*Assistant Examiner* — Tri Hoang
(74) *Attorney, Agent, or Firm* — Harness, Dickey & Pierce, P.L.C.

(57) ABSTRACT

Provided are memory devices and memory programming methods. A memory device may include: a multi-level cell array that includes a plurality of multi-level cells; a programming unit that programs a first data page in the plurality of multi-level cells and programs a second data page in a multi-level cell from among the plurality of multi-level cells in which the first data page is programmed; an error analysis unit that analyzes read error information corresponding to the first data page based on a read voltage level to determine whether to correct a read error based on the analyzed read error information; and a controller that adjusts the read voltage level of the first data page depending on the determination result. Through this, it is possible to reduce an error occurrence when reading and/or programming a data page.

16 Claims, 9 Drawing Sheets

MEMORY DEVICE AND MEMORY PROGRAMMING METHOD

PRIORITY STATEMENT

This application claims priority under 35 U.S.C. §119 to Korean Patent Application No. 10-2008-0065068, filed on Jul. 4, 2008, in the Korean Intellectual Property Office (KIPO), the entire contents of which are incorporated herein by reference.

BACKGROUND

1. Field

Example embodiments relate to apparatuses and/or methods of programming data in memory devices. Also, example embodiments relate to apparatuses and/or methods of programming data in a multi-level cell (MLC) or a multi-bit cell (MBC) memory device.

2. Description of Related Art

A single-level cell (SLC) memory device may store one bit of data in a single memory cell. The SLC memory may be referred to as a single-bit cell (SBC) memory. A process of storing one bit of data in a single level cell of the SLC memory device may be referred to as a programming process and may change a threshold voltage of the single level cell. For example, when data of logic value "1" is stored in a single level cell, the single level cell may have a threshold voltage of 1.0 V. When data of logic value "0" is stored in the single level cell, the single level cell may have a threshold voltage of 3.0 V.

Due to a minute electrical characteristic difference between single level cells, the threshold voltage formed in each of the single level cells with the same data programmed may have a distribution within a predetermined range. For example, when a voltage read from a memory cell is greater than 0.5 V and less than 1.5 V, it may be determined that data stored in the memory cell has a logic value of "1". When the voltage read from the memory cell is greater than 2.5 V and less than 3.5 V, it may be determined that the data stored in the memory cell has a logic value of "0". The data stored in the memory cell may be classified depending on the difference between memory cell currents/voltages during the reading operations.

Meanwhile, a multi-bit cell (MLC) memory device that can store data of two or more bits in a single memory cell has been proposed in response to a need for higher integration of memory. The MLC memory device may also be referred to as a multi-bit cell (MBC) memory. However, as the number of bits stored in the single memory cell increases, reliability may deteriorate and the read-failure rate may increase. To program 'm' bits in a single memory cell, any one of $2^m$ threshold voltages may be required to be formed in the memory cell. Due to the minute electrical characteristic difference between memory cells, threshold voltages of memory cells with the same data programmed may form a distribution within a predetermined range. A single threshold voltage distribution may correspond to each of $2^m$ data values that can be generated according to 'm' bits.

However, since the voltage window of a memory may be limited, the distance between $2^m$ distributions of threshold voltage between adjacent bits may decrease as 'm' increases, which may cause overlapping of the distributions. If the distributions are overlapped with each other, the read failure rate may increase.

Specifically, since distribution areas are overlapped with each other, an error may occur to thereby obstruct a state of information stored in a cell from being accurately read.

SUMMARY

Example embodiments may provide apparatuses and/or methods that can reduce an error occurrence when reading and/or programming a data page.

According to example embodiments, an apparatus may include a memory device. The memory device may include: a multi-level cell array that includes a plurality of multi-level cells; a programming unit that programs a first data page in the plurality of multi-level cells and programs a second data page in a multi-level cell from among the plurality of multi-level cells in which the first data page is programmed; an error analysis unit that analyzes read error information corresponding to the first data page based on a read voltage level to determine whether to correct a read error based on the analyzed read error information; and a controller that adjusts the read voltage level of the first data page depending on the determination result.

According to example embodiments, a method may include a memory programming method. The memory programming method may include: programming a first data page in a plurality of multi-level cells; analyzing read error information corresponding to the first data page based on a read voltage level to determine whether to correct a read error based on the analyzed read error information; adjusting the read voltage level of the first data page depending on the determination result; and programming a second data page in a multi-level cell, from among the plurality of multi-level cells in which the first data page is programmed, based on the read voltage level and the first data page.

BRIEF DESCRIPTION OF THE DRAWINGS

The above and other features and advantages of example embodiments will become more apparent by describing in detail example embodiments with reference to the attached drawings. The accompanying drawings are intended to depict example embodiments and should not be interpreted to limit the intended scope of the claims. The accompanying drawings are not to be considered as drawn to scale unless explicitly noted.

DETAILED DESCRIPTION OF EXAMPLE EMBODIMENTS

Figure 1:
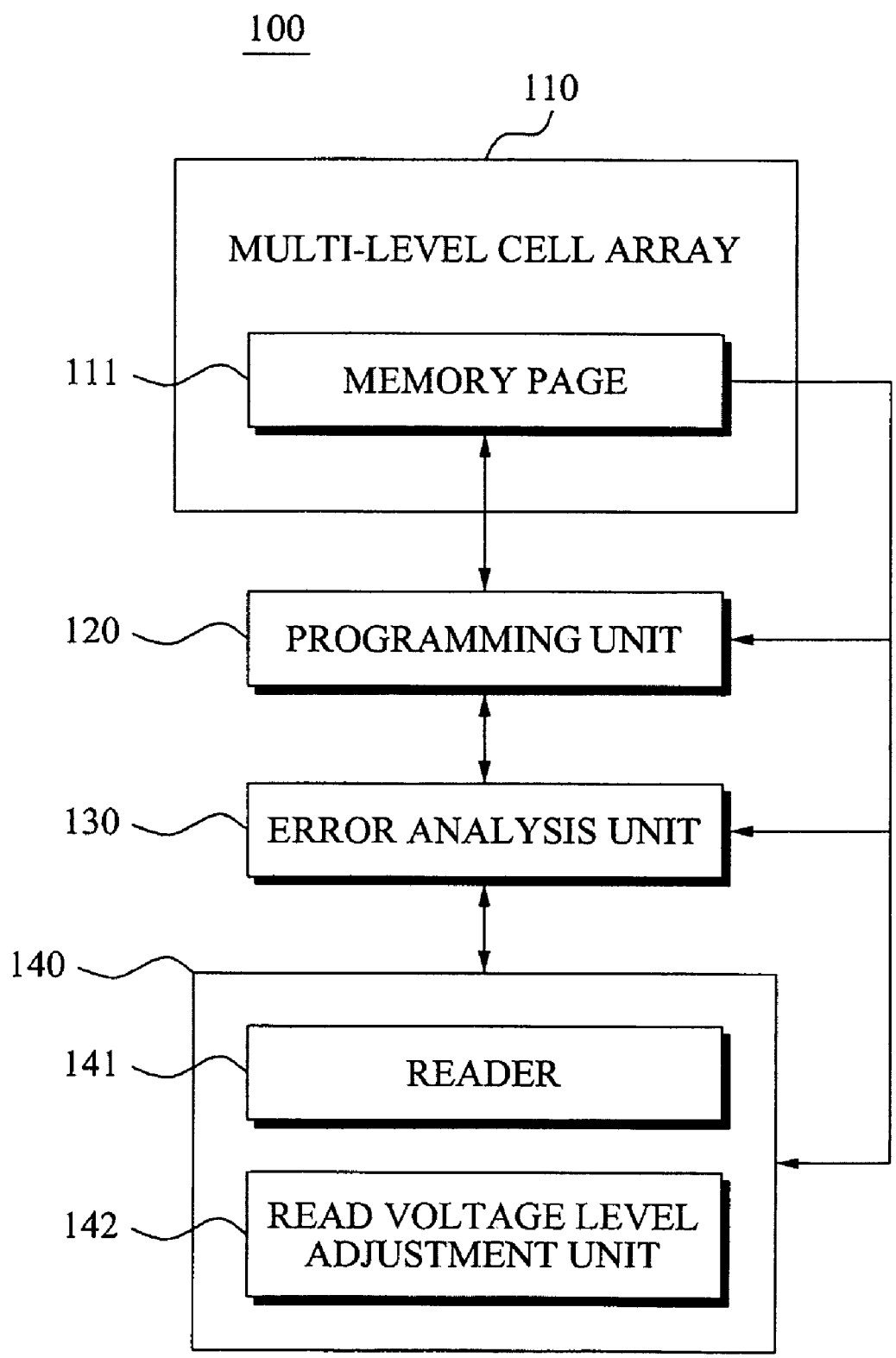
FIG. 1 is a block diagram illustrating an example of a memory device according to example embodiments.

Detailed example embodiments are disclosed herein. However, specific structural and functional details disclosed herein are merely representative for purposes of describing example embodiments. Example embodiments may, however, may be embodied in many alternate forms and should not be construed as being limited to only the embodiments set forth herein.

Accordingly, while example embodiments are capable of various modifications and alternate forms, embodiments thereof are shown by way of example in the drawings and will be described in detail. It should be understood, however, that there is not intent to limit example embodiments to the particular forms disclosed, but to the contrary, example embodiments are to cover all modifications, equivalents, and alternatives falling within the scope of example embodiments. Like numbers refer to like elements throughout the description of the figures.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

It will be understood that although the terms first, second, third, etc., may be used herein to describe various elements, components, regions, layers, and/or sections, these elements, components, regions, layers, and/or sections should not be limited by these terms. These terms are only used to distinguish one element, component, region, layer, and/or section from another element, component, region, layer, and/or section. For example, a first element, component, region, layer, and/or section could be termed a second element, component, region, layer, and/or section without departing from the teachings of example embodiments. As used herein, the term "and/or" includes any and all combinations of one or more of the associated listed items.

Spatially relative terms, such as "beneath," "below," "lower," "above," "upper," and the like may be used herein for ease of description to describe the relationship of one component and/or feature to another component and/or feature, or other component(s) and/or feature(s), as illustrated in the drawings. It will be understood that the spatially relative terms are intended to encompass different orientations of the device in use or operation in addition to the orientation depicted in the figures.

The terminology used herein is for the purpose of describing particular example embodiments only and is not intended to be limiting. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of stated features, integers, steps, operations, elements, and/or components, but do not preclude the presence or addition of one or more other features, integers, steps, operations, elements, components and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belongs. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

Reference will now be made to example embodiments, which are illustrated in the accompanying drawings, wherein like reference numerals may refer to like components throughout.

When it is determined detailed description related to a related known function or configuration they may make the purpose of example embodiments unnecessarily ambiguous in describing example embodiments, the detailed description will be omitted here. Also, terms used herein are defined to appropriately describe the exemplary embodiments of example embodiments and thus may be changed depending on a user, the intent of an operator, or a custom. Accordingly, the terms must be defined based on the following overall description of this specification.

FIG. 1 illustrates an example of a memory device 100 according to example embodiments.

Referring to FIG. 1, the memory device 100 may include a multi-level cell array 110, a programming unit 120, an error analysis unit 130, and a controller 140.

The multi-level cell array 110 may include a plurality of multi-level cells. A process of storing data in a multi-level cell of a non-volatile memory such as an electrically erasable programmable read only memory (EEPROM), a flash memory, and the like, may be referred to as a programming process. The above process may be a process of changing a threshold voltage of the multi-level cell.

The programming unit 120 may change a threshold voltage of each of the multi-level cells to thereby program data in each of the multi-level cells. When the single multi-level cell can store m-bit data, the threshold voltage of the multi-level cell may be any one of $2^m$ voltage levels.

A process of programming, by the programming unit 120, data in a multi-level cell may require a relatively longer period of time than a process of reading, by the memory device 100, the data stored in the multi-level cell. In order to reduce a total programming time, the programming unit 120 may simultaneously program data in a plurality of multi-level cells.

Herein, a set of simultaneously programmed multi-level cells may be referred to as a memory page 111. The memory page 111 may be a set of multi-level cells that are simultaneously programmed by the programming unit 120. When each multi-level cell of the memory page 111 stores m-bit data, the memory page 111 may store m data pages.

According to example embodiments, the programming unit 120 may perform a first page programming operation to thereby program a most significant bit (MSB) in the multi-level cells of the memory page 111. According to example embodiments, a set of MSBs programmed in the multi-level cells of the memory page 111 may be referred to as a first data page.

The programming unit 120 may perform a second page programming operation to thereby program a second bit in the multi-level cells of the memory page 111. According to example embodiments, a set of second bits programmed in the multi-level cells of the memory page 111 may be referred to as a second data page.

The programming unit 120 may perform an $m^{th}$ page programming operation to thereby program a least significant bit (LSB) in the multi-level cells of the memory page 111. According to example embodiments, a set of LSBs programmed in the multi-level cells of the memory page 111 may be referred to as an $m^{th}$ data page.

The error analysis unit 130 may analyze read error information corresponding to the first data page based on a read voltage level to determine whether to correct a read error based on the analyzed read error information.

The controller 140 may adjust the read voltage level of the first data page depending on the determination result. For this, the controller 140 may include a reader 141 that applies the read voltage level to the plurality of multi-level cells to read the first data page, and a read voltage level adjustment unit 142 that adjusts the read voltage level depending on the result of the determination.

According to example embodiments, the controller 140 may adjust the read voltage level based on the read error information of the first data page, and the programming unit 120 may program the second data page based on the first data page and the adjusted read voltage level.

According to example embodiments, the controller 140 may adjust the read voltage level based on additional information corresponding to the first data page. The additional information may be included in the read error information. The additional information may include location information of the plurality of multi-level cells with the programmed first data page, programming sequence information associated with a programming sequence of the first data page, program/erase (P/E) cycle information, charge loss information, information associated with a number of bits of the read error, and bit ordering information.

The read error information may include error counting information associated with a number of error bits of the first data page. When the error analysis unit 130 determines the counting information is beyond the range of an error correcting limit, the controller 140 may adjust the read voltage level in order to reduce the number of the read error. The error correcting limit is related to the ability of an ECC process to correct the error bits of the first page. When the read error is corrected, the programming unit 120 may program the second data page.

Alternatively, when error analysis unit 130 determines the error counting information is within the range of the error correcting limit, the programming unit 120 may program data from the second data page in the multi-level cell with the programmed first data page, and the controller 140 may not adjust the read voltage level to correct the read error.

According to example embodiments, the read error information may include error detection information associated with the first data page, and the error analysis unit 130 may determine whether to correct the read error based on the error detection information. According to example embodiments, the controller 140 may adjust the read voltage level of the first data page based on the error detection information.

According to example embodiments, the controller 140 may repeat, in a predetermined number of loops, a process of reading/re-reading the first data page based on the adjusted read voltage level.

According to example embodiments, the error analysis unit 130 may perform comparison and analysis for an error correction decoding time spent for correction of the read error and a read time spent for reading of the first data page to apply adjusted read voltage level to the plurality of multi-level cells. As a result, when the error correction decoding time is less than the read time, the controller 140 may not adjust the read voltage level to correct the read error. Alternatively, when the error correction decoding time is greater than or equal to the read time, the controller 140 may adjust the read voltage level to correct the read error.

When there is a need to correct the read error after programming the first data page and reading the first data page based on the read voltage level, the memory device 100 may correct the read error and then program the second data page, or may adjust the read voltage level. Also, when the read error does not exist, or when the read error is within the range of the error correcting limit, the memory device 100 may program the second data page without correcting the read error or without adjusting the read voltage level.

Through this, the memory device 100 may minimize or lower the read error in a read process that is performed when programming data from a data page in a multi-level cell. Hereinafter, an operation of the memory device 100 will be described in detail with reference to FIG. 2.

Figure 2:
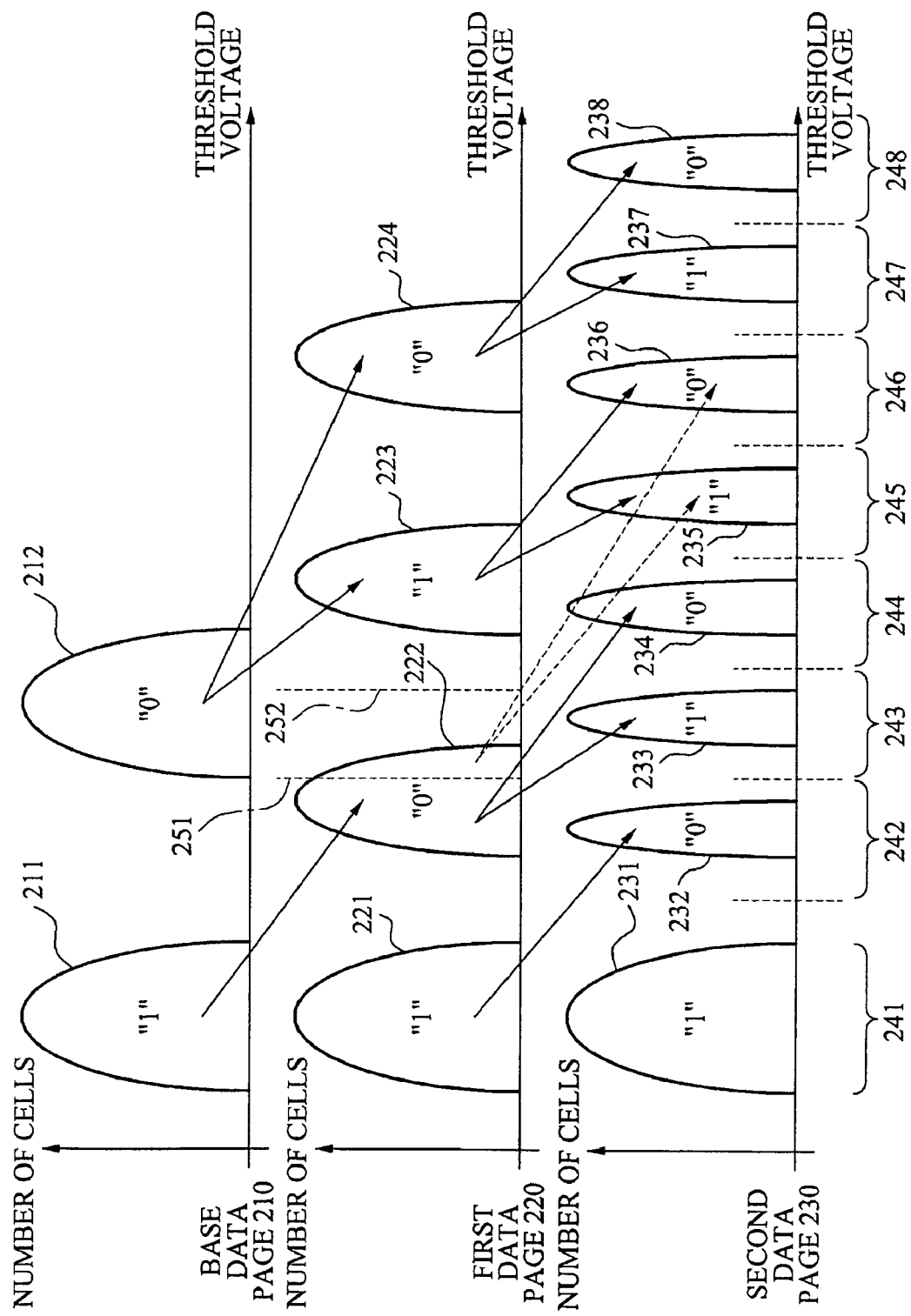
FIG. 2 illustrates an example of an operation of the memory device shown in FIG. 1.

FIG. 2 illustrates an example of an operation of the memory device 100 shown in FIG. 1.

Referring to FIG. 2, the horizontal axis denotes a threshold voltage and the vertical axis denotes a number of multi-level cells corresponding to the threshold voltage.

After a base data page 210 is programmed, a threshold voltage of multi-level cells of the multi-level cell array 110 may correspond to a distribution 211 and a distribution 212.

According to example embodiments, the base data page 210 may correspond to an MSB. The MSB may be "1" or "0". A threshold voltage of multi-level cells with the programmed MSB "1" may correspond to the distribution 211. A threshold voltage of multi-level cells with the programmed MSB "0" may correspond to the distribution 212.

The programming unit 120 may perform a base page programming operation to form the distributions 211 and 212.

The memory device 100 may set any one voltage level between the distributions 211 and 212 as a read voltage level. The memory device 100 may identify a threshold voltage state of multi-level cells of the multi-level cell array 110 using the set read voltage level. The memory device 100 may decide whether the threshold voltage of multi-level cells corresponds to the distribution 211 or the distribution 212 based on the set read voltage level.

The programming unit 120 may perform a first page programming operation to thereby form distributions 221, 222, 223, and 224. Through this, the programming unit 120 may form a first data page 220.

After the base data page 210 is programmed, the memory device 100 may perform a read process for the base data page 210 based on the read voltage level. When there is a need to correct the read error, the memory device 100 may correct the read error and then program the first data page 220 or may adjust the read voltage level. When the read error does not exist, or when the read error is within the range of the error correcting limit, the memory device 100 may program the first data page 220 without correcting the read error or without the adjusting the read voltage level. According to example embodiments, the first data page 220 may correspond to a second bit.

Through the aforementioned process, the programming unit 120 may perform a second programming operation to thereby form distributions 231, 232, 233, 234, 235, 236, 237, and 238. Through this, the programming unit 120 may form a second data page 230. According to example embodiments, the second data page 230 may correspond to a third bit.

A read voltage level 251 is an example of an erroneously selected read voltage level. The memory device 100 may determine whether a threshold voltage of a multi-level cell is above or below the voltage level 251. The memory device 100 may identify a state of a multi-level cell with a threshold voltage greater than the read voltage level 251 among multi-level cells corresponding to the distribution 222. Since the memory device 100 sets a threshold voltage interval 245 with respect to multi-level cells to be programmed with LSB "1" among multi-level cells corresponding to the distribution 222, a portion of the multi-level cells corresponding to the distribution 222 may form the distribution 235. According to example embodiments, a multi-level cell corresponding to the distribution 235 may be regarded as storing data "011". Some of the multi-level cells corresponding to the distribution 235 are formed in the distribution 222. Thus, data that should have been stored in the multi-level cells may be "101", but currently stored data may actually be "011". The memory device 100 may erroneously select the voltage level 251 as the read voltage level and thereby cause an error in the base data page 210 and the first data page 220 (an MSB and a second bit) during the second page data programming operation.

Herein, an operation of performing, by the memory device 100, a threshold voltage state identifying operation between page programming operations may be referred to as an "internal read operation".

After the first data page 220 is programmed, the memory device 100 may perform a read process for the first data page 220 based on the read voltage level. When there is a need to correct the read error, the memory device 100 may correct the read error and then program the second data page 230 or may adjust the read voltage level. When the read error does not exist, or when the read error is within the range of the error correcting limit, the memory device 100 may program the second data page 230 without correcting the read error or without the adjusting the read voltage level.

More specifically, as described above with reference to FIG. 1, the memory device 100 may analyze read error information corresponding to the first data page based on a read voltage level to determine whether to correct a read error based on the analyzed read error information, and may adjust the read voltage level of the first data page depending on the result of the determination.

According to example embodiments, the memory device 100 may adjust the read voltage level based on the read error information of the first data page, and program the second data page based on the first data page and the adjusted read voltage level.

According to example embodiments, the memory device 100 may adjust the read voltage level based on additional information corresponding to the first data page. The additional information may be included in the read error information. The additional information may include location information of the plurality of multi-level cells with the programmed first data page, programming sequence information associated with a programming sequence of the first data page, P/E cycle information, charge loss information, information associated with a number of bits of the read error, and bit ordering information.

The read error information may include error counting information associated with a number of error bits of the first data page. When the error counting information is beyond the range of the error correcting limit, the memory device 100 may correct the read error. When the read error is corrected, the memory device 100 may program the second data page. Alternatively, when the error counting information is within the range of the error correcting limit, the memory device 100 may program data from the second data page in the multi-level cell with the programmed first data page, instead of correcting the read error.

According to example embodiments, the read error information may include error detection information associated with the first data page, and the memory device 100 may determine whether to correct the read error based on the error detection information. According to example embodiments, the memory device 100 may adjust the read voltage level of the first data page based on the error detection information.

According to example embodiments, the memory device 100 may repeat, in a predetermined number of loops, a process of reading/re-reading the first data page based on the adjusted read voltage level.

According to example embodiments, the memory device 100 may apply an error correction decoding time spent for correction of the read error and the adjusted read voltage level to the plurality of multi-level cells to perform comparison and analysis for a read time spent for reading of the first data page. As a result, when the error correction decoding time is less than the read time, the memory device 100 may not adjust the read voltage level to correct the read error. Alternatively, when the error correction decoding time is greater than or equal to the read time, the memory device 100 may adjust the read voltage level to correct the read error.

According to example embodiments, the first data page may be an $n^{th}$ bit of data stored in a multi-level cell, and the second data page may be an $(n+1)^{th}$ bit of the stored data.

According to example embodiments, the memory device 100 may selectively adjust the read voltage level or may correct the read error depending on whether the first data page is included in a selected bit interval, for example, $k^{th}$ bit<$n^{th}$ bit<$m^{th}$ bit.

Through this, it may be possible to effectively control the internal read including the read error. Hereinafter, a programming method of memory page data that can be performed in a memory device according to example embodiments will be described in detail.

Figure 3:
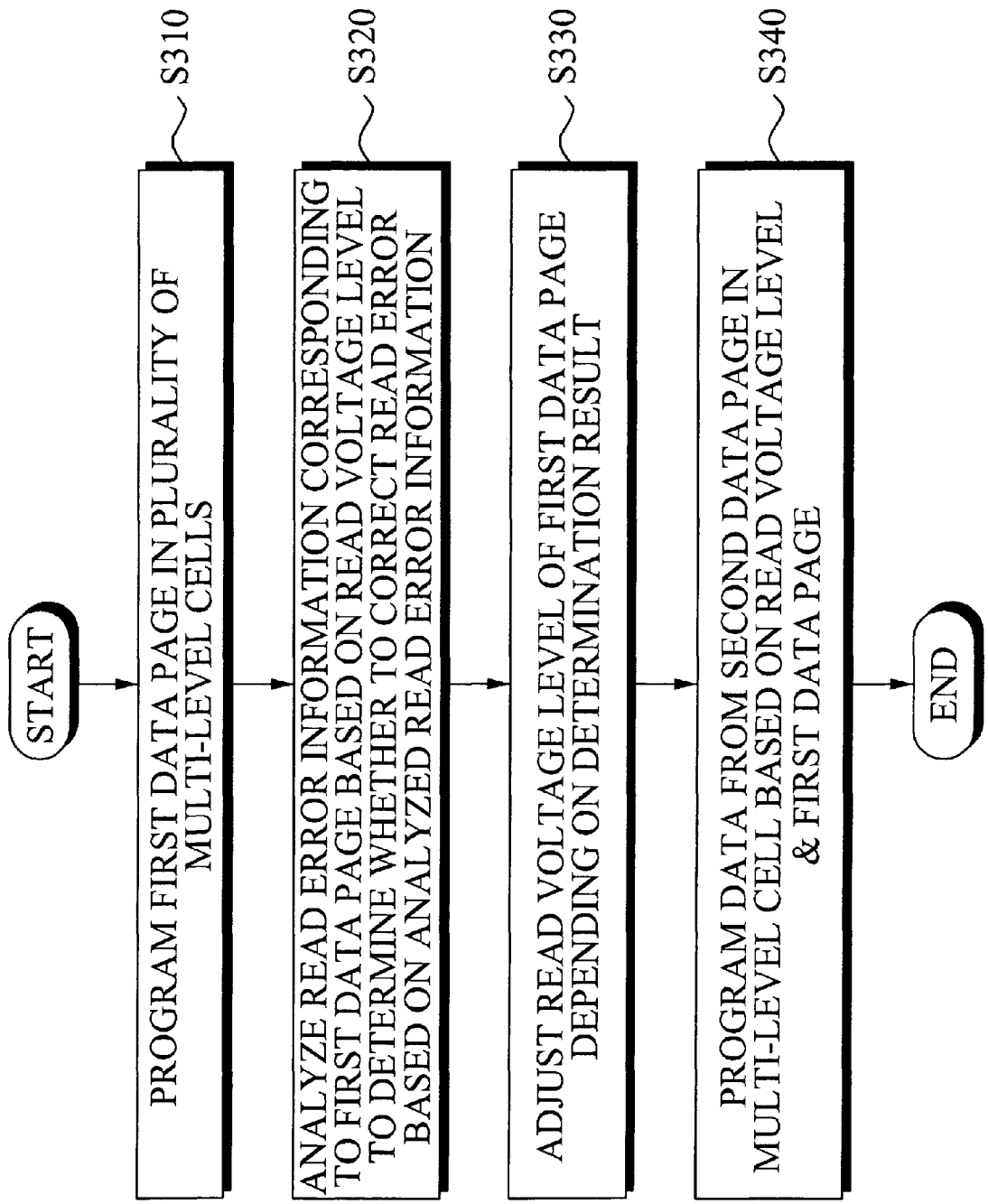
FIG. 3 is a flowchart for describing a memory programming method according to example embodiments.
Figure 4:
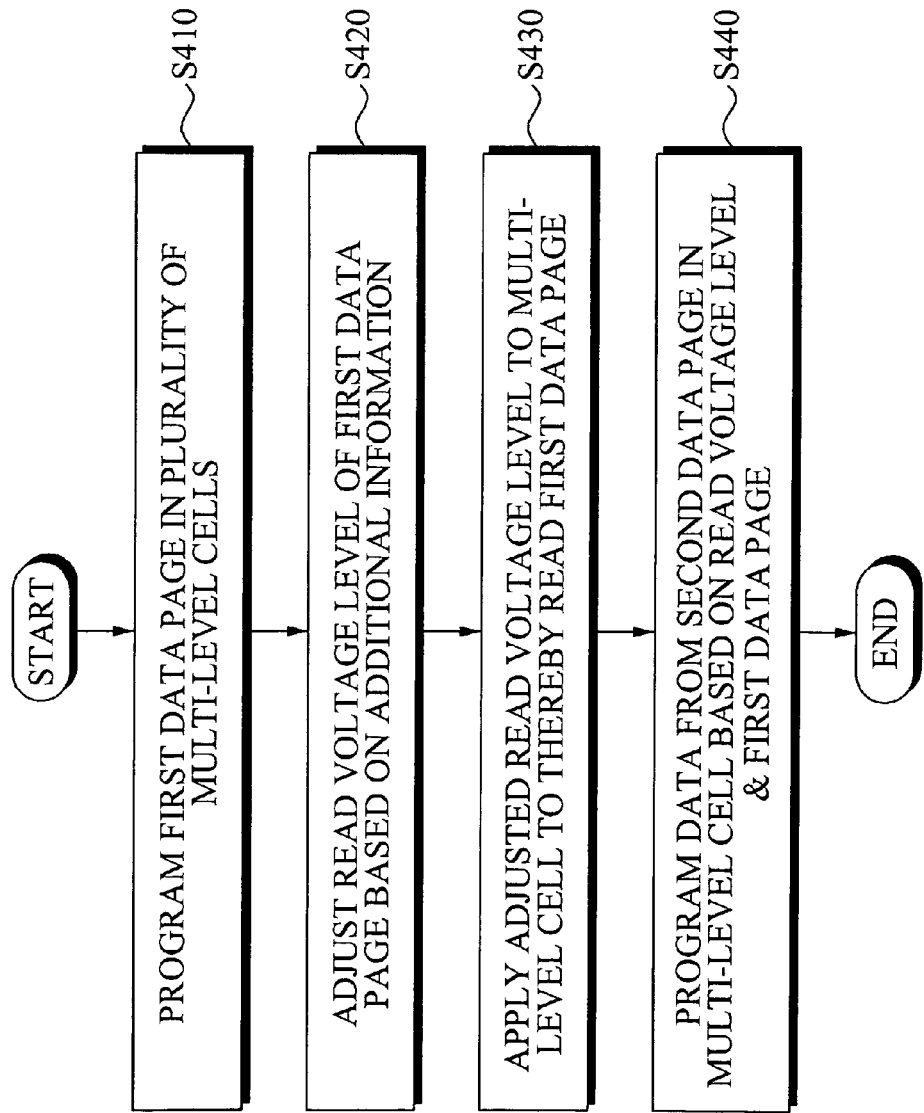
FIGS. 4 through 9 are flowcharts illustrating examples of a memory programming method according to example embodiments.

FIG. 3 is a flowchart for describing a memory programming method according to example embodiments.

Referring to FIG. 3, the memory programming method may program a first data page in a plurality of multi-level cells in operation S310.

In operation S320, the memory programming method may analyze read error information corresponding to the first data page based on a read voltage level to determine whether to correct a read error based on the analyzed read error information.

The read error information may include additional information corresponding to the first data page. According to example embodiments, the read error information may include error counting information associated with a number of error bits included in the first data page.

Also, according to example embodiments, the read error information may include error detection information associated with the first data page.

In operation S330, the memory programming method may adjust the read voltage level of the first data page depending on the determination result.

In operation S340, the memory programming method may program data from a second data page in a multi-level cell, which may have programmed data from the first data page, based on the read voltage level and the first data page.

When there is a need to correct the read error after programming the first data page and reading the first data page based on the read voltage level, the memory programming method may correct the read error and then program the second data page, or may adjust the read voltage level. Also, when the read error does not exist, or when the read error is within the range of the error correcting limit, the memory programming method may program the second data page without correcting the read error or without adjusting the read voltage level.

Hereinafter, examples of a memory programming method according to example embodiments will be described with reference to FIGS. 4 through 9.

FIGS. 4 through 9 are flowcharts illustrating examples of a memory programming method according to example embodiments.

In operation S410, the memory programming method may program a first data page in a plurality of multi-level cells.

In operation S420, the memory programming method may adjust a read voltage level of the first data page based on additional information included in read error information. The additional information may include location information of the plurality of multi-level cells with the programmed first data page, programming sequence information associated with a programming sequence of the first data page, P/E cycle information, charge loss information, information associated with a number of bits of the read error, and bit ordering information.

The location information may denote information associated with a location of a multi-level cell corresponding to a distribution after the first data page is programmed. According to example embodiments, the memory programming method may adjust, to a first read voltage level, a read voltage level of multi-level cells corresponding to a first location among the plurality of multi-level cells based on the location information. The memory programming method may adjust, to a second read voltage level, a read voltage level of multi-level cells corresponding to a second location, based on the location information.

The memory programming method may perform an internal read operation based on the read voltage level that is adjusted according to the location information.

According to example embodiments, the location information may be used to classify a multi-level cell connected to a first word line and a multi-level cell connected to a second word line among multi-level cells with the programmed first data page. Characteristics of multi-level cells connected to different word lines may be different from each other. Thus, the memory programming method may adjust a read voltage level of the internal read operation according to a word line connected with the multi-level cells.

According to example embodiments, the location information may be used to classify a multi-level cell connected to an even bit line and a multi-level cell connected to an odd bit line among multi-level cells with the programmed first data page. Characteristics of multi-level cells connected to the even bit line may be different from characteristics of the multi-level cells connected to the odd bit line. Thus, the memory programming method may determine the read voltage level of the internal read operation according to a bit line connected with the multi-level cells.

The P/E cycle information may denote information associated with a number of cycles where a multi-level cell is programmed and is erased. As the P/E cycle of the multi-level cell increases, charge retention of the multi-level cell may be degraded. The memory programming method may adjust the read voltage level of the internal read operation according to the number of P/E cycles of the multi-level cell. For example, the memory programming method may classify a multi-level cell with the number of P/E cycles less than a predetermined number of times and a multi-level cell with the number of P/E cycles greater than or equal to the predetermined number of times and then may adjust the read voltage level respectively.

The programming sequence information may denote information associated with a time when the first data page is programmed in the multi-level cells. The memory programming method may adjust the read voltage level of the internal read operation according to the programmed sequence of the multi-level cells. Specifically, multi-level cells programmed in a first time interval may receive an undesired affect prior to a programming operation that is performed in a second time interval. For example, a mechanism of affecting a programmed multi-level cell prior to a subsequent programming operation may be program disturbance, floating gate (FG) coupling, and the like.

In operation S430, the memory programming method may apply the adjusted read voltage level to a multi-level cell to thereby read data from the first data page.

In operation S440, the memory programming method may program data from a second data page in the multi-level cell, which may have programmed data from first data page, based on the read voltage level and the first data page.

Figure 5:
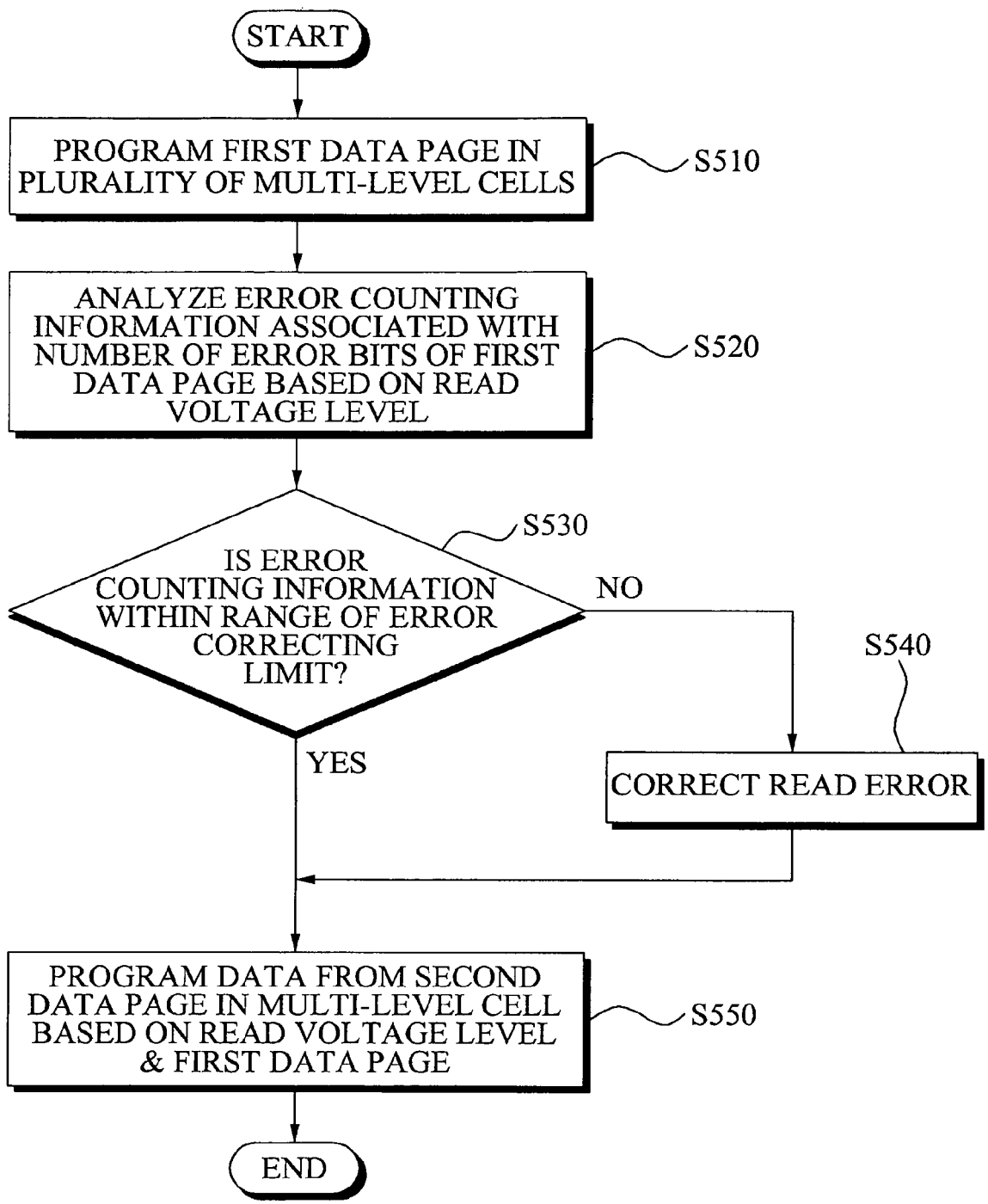

Referring to FIG. 5, the memory programming method may program a first data page in a plurality of multi-level cells in operation S510.

In operation S520, the memory programming method may analyze error counting information associated with a number of error bits of the first data page based on a read voltage level. Also, in operation S520, the memory programming method may analyze the number of read error bits based on an error counting code.

In operation S530, the memory programming method may determine whether the error counting information is within the range of the error correcting limit. In operation S540, when the error counting information is beyond the range of the error correcting limit, the memory programming method may correct the read error by adjusting the read voltages.

Alternatively, when the error counting information is within the range of the error correcting limit, the memory programming method may not need to correct the read error by adjusting the read voltages and may program a second data page in the multi-level cell with the programmed first data page based on the read voltage level and the first data page in operation S550.

Figure 6:
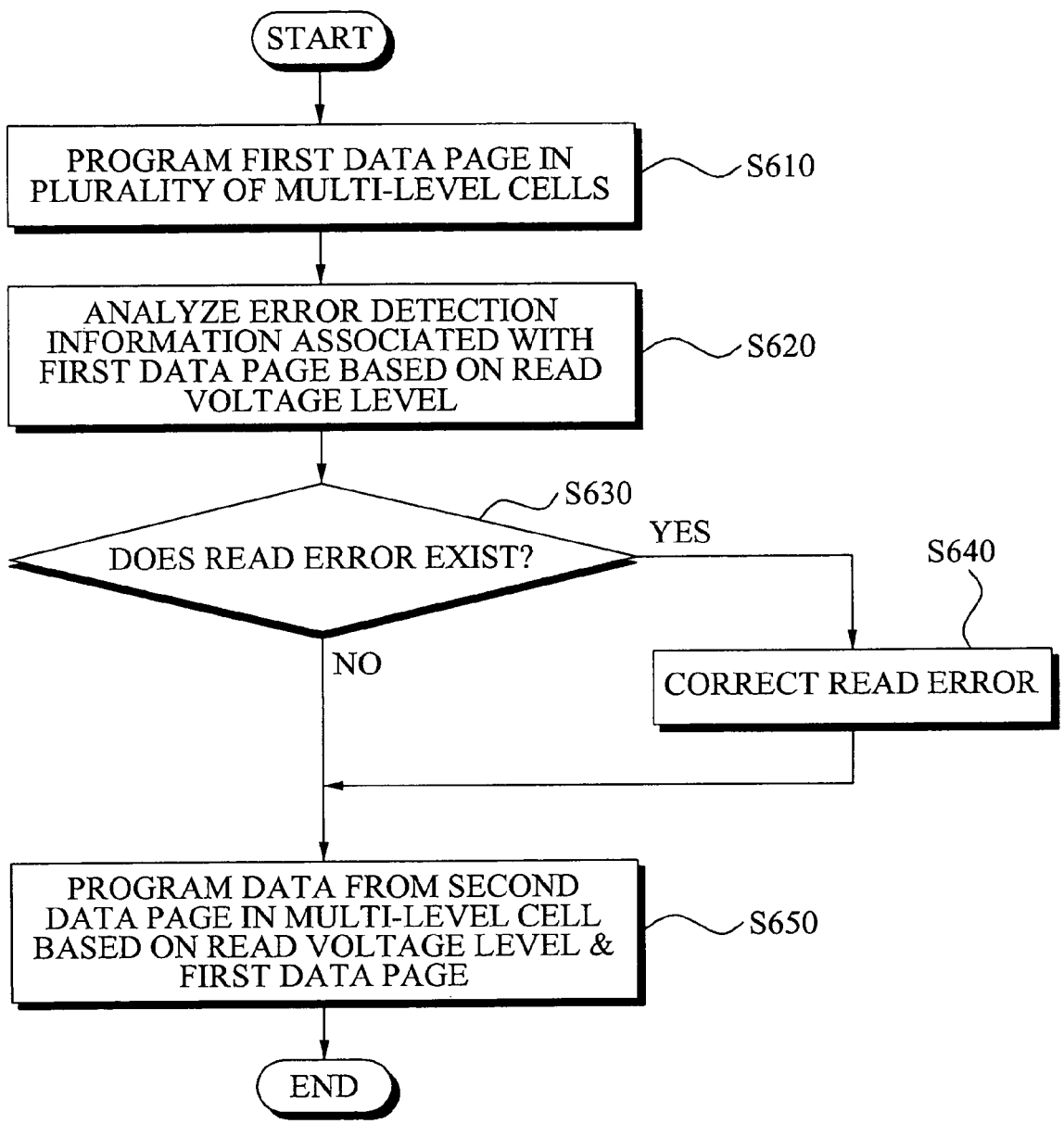

Referring to FIG. 6, the memory programming method may program a first data page in a plurality of multi-level cells in operation S610.

In operation S620, the memory programming method may analyze error detection information associated with a first data page based on a read voltage level. Also, in operation S620, the memory programming method may determine whether a read error exists based on an error detection code.

In operation S630, the memory programming method may determine whether the read error exists. In operation S640, when the read error exists, the memory programming method may correct the read error. The process of correcting the read error may include an ECC process.

Alternatively, when the read error does not exist, the memory programming method may not need to correct the read error and may program a second data page in the multi-level cell with the programmed first data page based on the read voltage level and the first data page in operation S650.

Figure 7:
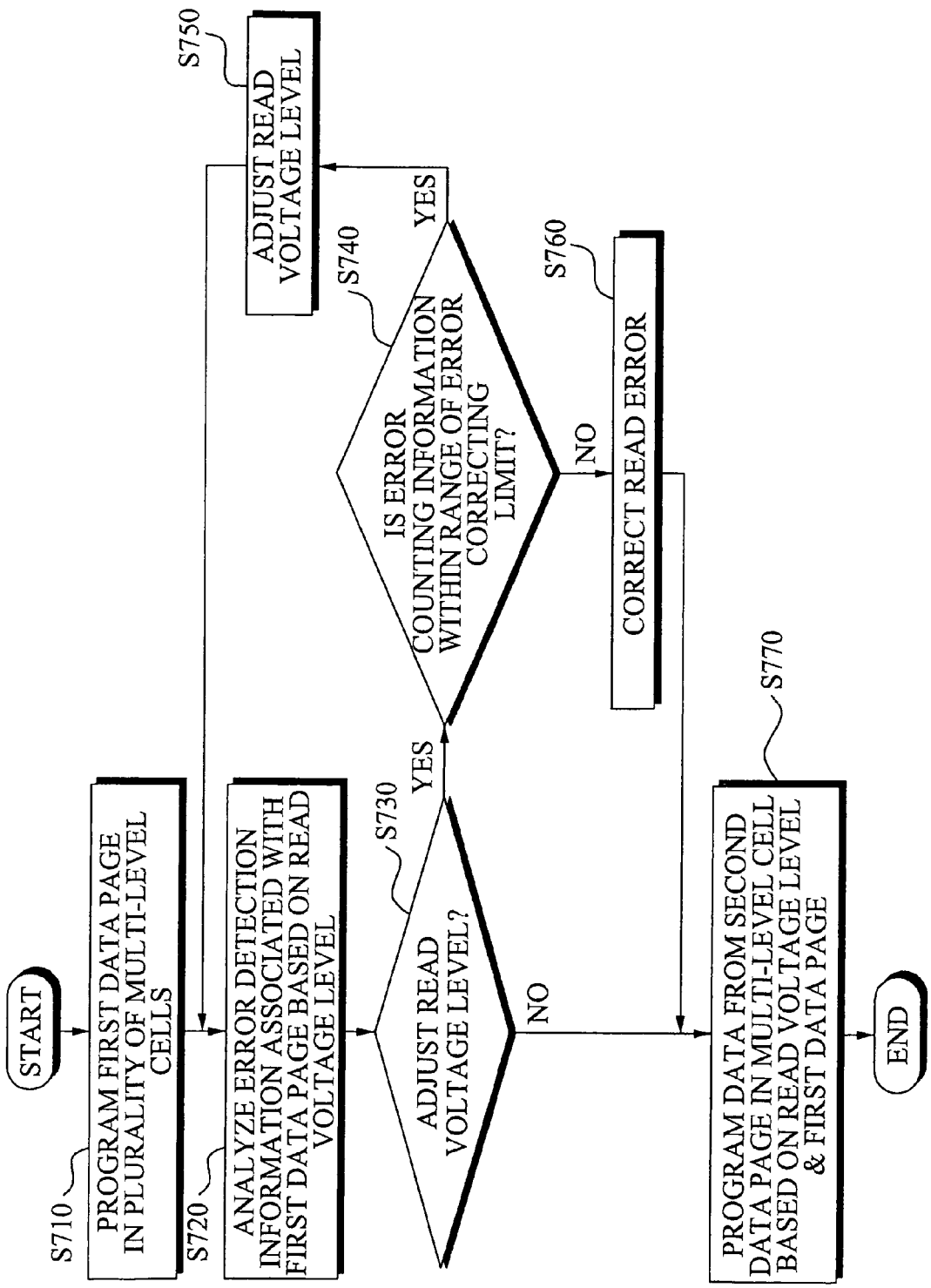

Referring to FIG. 7, the memory programming method may program a first data page in a plurality of multi-level cells in operation S710.

In operation S720, the memory programming method may analyze error detection information associated with a first data page based on a read voltage level. Also, in operation S720, the memory programming method may determine whether a read error exists based on an error detection code.

In operation S730, the memory programming method may determine whether it is necessary to adjust the read voltage level according to the error detection information.

When it is necessary to adjust the read voltage level, the memory programming method may analyze error counting information associated with a number of error bits included in the first data page based on the read voltage level to thereby determine whether the error counting information is within the range of the error correcting limit in operation S740.

In operation S750, when the error counting information is within the range of the error correcting limit, the memory programming method may adjust the read voltage level and go to operation S720. Alternatively, when the error counting information is beyond the range of error correcting limit, the memory programming method may correct the read error without adjusting the read voltage level in operation S760. The process of correcting the read error may include an ECC process.

When it is not necessary to adjust the read voltage level as a result of determination in operation S730, the memory programming method may program a second data page in the multi-level cell with the programmed first data page based on the read voltage level and the first data page without the process of adjusting the read voltage level or the process of correcting the read error, for example the ECC process.

According to the memory programming method of FIG. 7, since the read voltage level may be adjusted or the read error may be corrected based on the error detection information and the error counting information, it may be possible to effectively control the read error when selectively performing the internal read operation.

Figure 8:
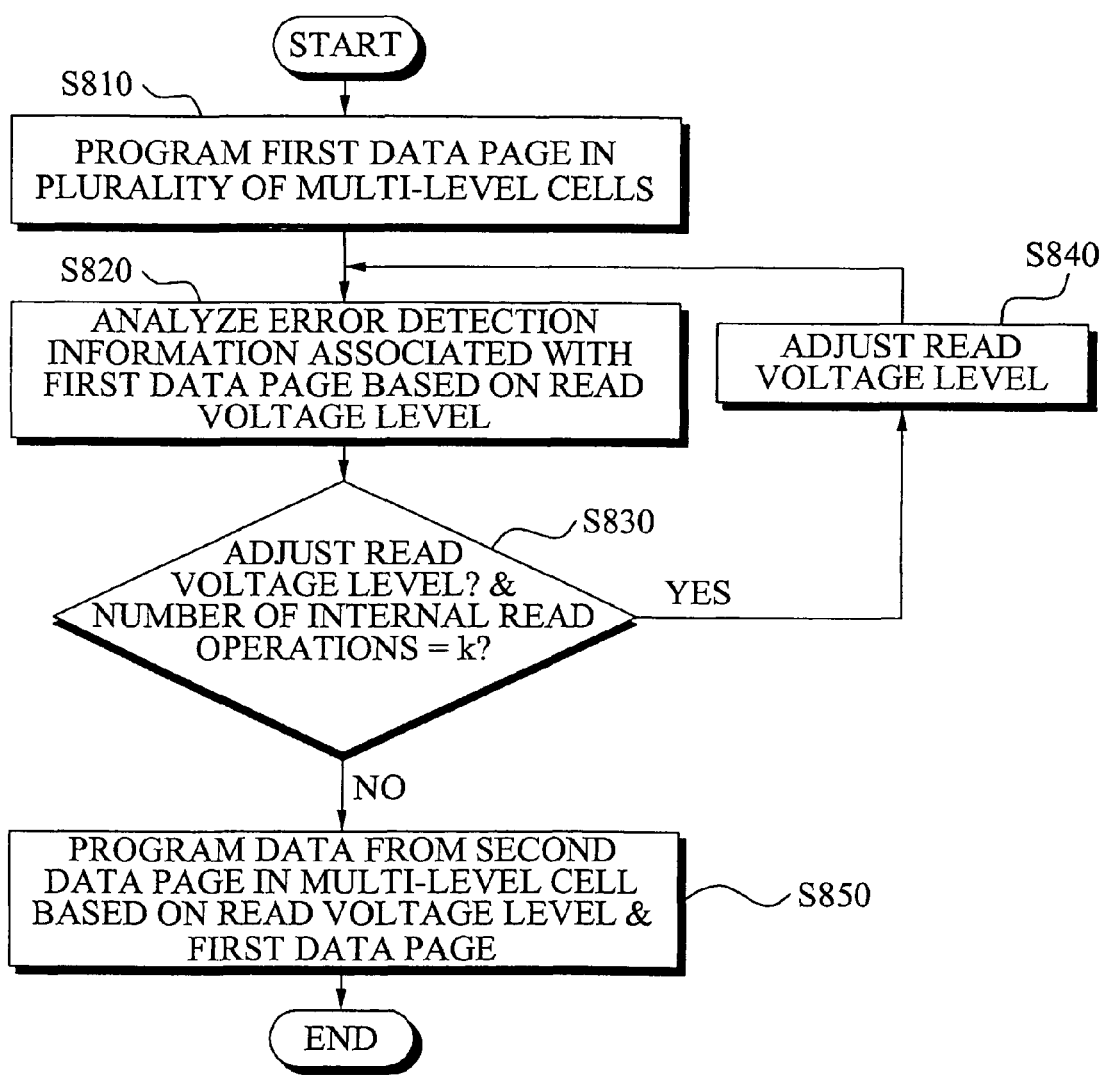

Referring to FIG. 8, the memory programming method may program a first data page in a plurality of multi-level cells in operation S810.

In operation S820, the memory programming method may analyze error detection information associated with the first data page based on a read voltage level. Also, in operation S820, the memory programming method may determine whether the read error exists based on an error detection code.

In operation S830, the memory programming method may determine whether it is necessary to adjust the read voltage level based on the error detection information and a number of loops where the internal read operation is performed according to the adjustment of the read voltage level.

In operation S840, only when it is necessary to adjust the read voltage level and the internal read operation is performed in a predetermined number of k loops, the memory programming method may adjust the read voltage level of the first data page.

Alternatively, when it is not necessary to adjust the read voltage level or when the internal read operation is not performed in the predetermined number of k loops, the memory programming method may program data from a second data page in a multi-level cell, which may have with programmed data from the first data page, based on the read voltage level and the first data page without adjusting the read voltage level in operation S850.

Figure 9:
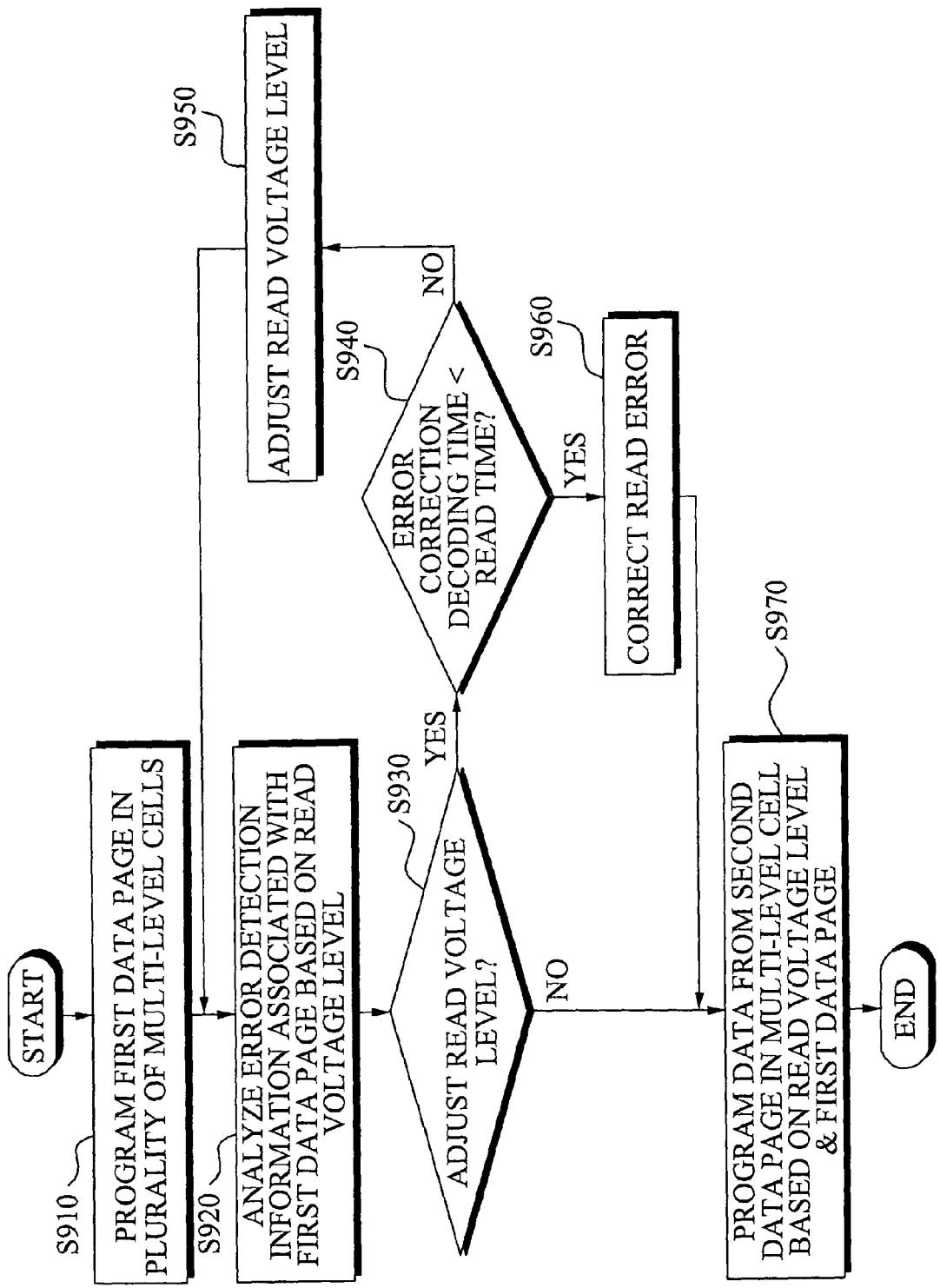

Referring to FIG. 9, the memory programming method may program a first data page in a plurality of multi-level cells in operation S910.

In operation S920, the memory programming method may analyze error detection information associated with the first data page based on a read voltage level. Also, in operation S920, the memory programming method may determine whether the read error exists based on an error detection code.

In operation S930, the memory programming method may determine whether it is necessary to adjust the read voltage level based on the error detection information.

When it is necessary to adjust the read voltage level, the memory programming method may apply an error correction decoding time spent for correction of the read error and the adjusted read voltage level to the plurality of multi-level cells to perform comparison and analysis for a read time spent for reading of the first data page in operation S940. This is because the read time increases as the number of bits included in the multi-level cell increases.

In operation S950, when the error correction decoding time is greater than or equal to the read time, the memory programming method may adjust the read voltage level and proceed to operation S920.

Alternatively, when the error correction decoding time is less than the read time, the memory programming method may correct the read error. The process of correcting the read error may include an ECC process.

Also, when it is not necessary to adjust the read voltage level as a determination result in operation S930, the memory programming method may program data from a second data page in a multi-level cell, which may have programmed data from the first data page based on the read voltage level and the first data page without the process of adjusting the read voltage level or the process of correcting the read error, for example the ECC process.

Example embodiments may be applicable to memory devices that change a threshold voltage of a memory cell to thereby store data, for example, a flash memory, an EEPROM, and the like.

The memory programming method according to example embodiments may be recorded in computer-readable media including program instructions to implement various operations embodied by a computer. The media may also include, alone or in combination with the program instructions, data files, data structures, and/or the like. The media and program instructions may be those especially designed and constructed for the purposes of example embodiments, or they may be of the kind well-known and available to those having skill in the computer software arts. Examples of computer-readable media include magnetic media, for example hard disks, floppy disks, and magnetic tape; optical media, for example CD ROM disks and DVD; magneto-optical media, for example optical disks; and hardware devices that are especially configured to store and perform program instructions, for example read-only memory (ROM), random access memory (RAM), flash memory, and the like. Examples of program instructions include both machine code, for example produced by a compiler, and files containing higher level code that may be executed by the computer using an interpreter. The described hardware devices may be configured to act as one or more software modules in order to perform the operations of example embodiments.

Flash memory devices and/or memory controllers according to example embodiments may be embodied using various types of packages. For example, the flash memory devices and/or memory controllers may be embodied using packages, for example Package on Packages (PoPs), Ball Grid Arrays (BGAs), Chip Scale Packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Quad Flatpack (QFP), Small Outline Integrated Circuit (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP), and the like.

The flash memory devices and/or the memory controllers may constitute memory cards. In example embodiments, the memory controllers may be constructed to communicate with an external device for example, a host using any one of various types of protocols, for example a Universal Serial Bus (USB), a Multi Media Card (MMC), a Peripheral Component Interconnect-Express (PCI-E), Serial Advanced Technology Attachment (SATA), Parallel ATA (PATA), Small Computer System Interface (SCSI), Enhanced Small Device Interface (ESDI), and Integrated Drive Electronics (IDE).

The flash memory devices may be non-volatile memory devices that may maintain stored data even when power is cut off. According to an increase in the use of mobile devices, for example a cellular phone, a personal digital assistant (PDA), a digital camera, a portable game console, and an MP3 player, the flash memory devices may be more widely used as data storage and code storage. The flash memory devices may be used in home applications, for example a high definition television (HDTV), a digital video disk (DVD), a router, and a Global Positioning System (GPS).

A computing system, according to example embodiments, may include a microprocessor that may be electrically connected with a bus, a user interface, a modem, for example a baseband chipset, a memory controller, and a flash memory device. The flash memory device may store N-bit data via the memory controller. The N-bit data may be processed or will be processed by the microprocessor and N may be 1 or an integer greater than 1. When the computing system is a mobile apparatus, a battery may be additionally provided to supply operation voltage to the computing system.

It will be apparent to those of ordinary skill in the art that the computing system according to example embodiments may further include an application chipset, a camera image processor (CIS), a mobile Dynamic Random Access Memory (DRAM), and the like. The memory controller and the flash memory device may constitute a solid state drive/disk (SSD) that uses a non-volatile memory to store data.

Example embodiments having thus been described, it will be obvious that the same may be varied in many ways. Such variations are not to be regarded as a departure from the intended spirit and scope of example embodiments, and all such modifications as would be obvious to one skilled in the art are intended to be included within the scope of the following claims.

What is claimed is:

1. A memory device comprising:
   a multi-level cell array that includes a plurality of multi-level cells;
   a programming unit that programs a first data page in the plurality of multi-level cells and programs data from a second data page in a multi-level cell from among the plurality of multi-level cells in which the first data page is programmed;
   an error analysis unit that analyzes read error information corresponding to the first data page based on a read voltage level to determine whether to correct a read error based on the analyzed read error information; and
   a controller that adjusts the read voltage level of the first data page depending on the determination result.

2. The memory device of claim 1, wherein the controller comprises:
   a reader that applies the read voltage level to the plurality of multi-level cells to read the first data page; and
   a read voltage level adjustment unit that adjusts the read voltage level depending on the determination result.

3. The memory device of claim 1, wherein:
   the controller adjusts the read voltage level based on the read error information of the first data page, and
   the programming unit programs the second data page based on the first data page and the adjusted read voltage level.

4. The memory device of claim 1, wherein the controller adjusts the read voltage level based on additional information corresponding to the first data page.

5. The memory device of claim 4, wherein the additional information comprises at least one of location information of the plurality of multi-level cells with the programmed first data page, programming sequence information associated with a programming sequence of the first data page, program/erase (P/E) cycle information, charge loss information, information associated with a number of bits of the read error, and bit ordering information.

6. The memory device of claim 1, wherein:
   the read error information comprises error counting information associated with a number of error bits of the first data page,
   when the error counting information is beyond the range of an error correcting limit, the memory device corrects the read error, and
   when the read error is corrected, the programming unit programs the second data page.

7. The memory device of claim 6, wherein, when the error counting information is within the range of the error correcting limit, the controller adjusts the read voltage level based on the error counting information.

8. The memory device of claim 6, wherein, when the error counting information is within the range of the error correcting limit, the programming unit programs the second data page in the multi-level cell with the programmed first data page.

9. The memory device of claim 1, wherein:
   the read error information comprises error detection information associated with the first data page, and
   the error analysis unit determines whether to correct the read error based on the error detection information.

10. The memory device of claim 9, wherein the controller adjusts the read voltage level of the first data page based on the error detection information.

11. The memory device of claim 1, wherein the controller repeats re-reading of the first data page in a predetermined number of loops based on the adjusted read voltage level.

12. The memory device of claim 1, wherein the error analysis unit applies an error correction decoding time spent for correction of the read error and the adjusted read voltage level to the plurality of multi-level cells to perform comparison and analysis for a read time spent for reading of the first data page.

13. The memory device of claim 12, wherein, when the error correction decoding time is less than the read time, the controller does not adjust the read voltage level.

14. The memory device of claim 12, wherein, when the error correction decoding time is greater than or equal to the read time, the controller adjusts the read voltage level.

15. A memory programming method comprising:
   programming a first data page in a plurality of multi-level cells;
   analyzing read error information corresponding to the first data page based on a read voltage level to determine whether to correct a read error based on the analyzed read error information;
   adjusting the read voltage level of the first data page depending on the determination result; and
   programming a second data page in a multi-level cell, from among the plurality of multi-level cells in which the first data page is programmed, based on the read voltage level and the first data page.

16. A computer-readable recording medium storing a program for implementing the method of claim 15.

* * * * *